United States Patent
Lee et al.

(10) Patent No.: US 10,396,252 B2
(45) Date of Patent: Aug. 27, 2019

(54) LED PACKAGE STRUCTURE WITH MULTIPLE COLOR TEMPERATURES AND METHOD FOR MANUFACTURING THE SAME

(71) Applicants: LITE-ON OPTO TECHNOLOGY (CHANGZHOU) CO., LTD., Changzhou, Jiangsu Province (CN); LITE-ON TECHNOLOGY CORPORATION, Taipei (TW)

(72) Inventors: Wen Lee, Shiyan (CN); Ju-Shan Lu, Changzhou (CN); Shu-Yong Jia, Changzhou (CN)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 73 days.

(21) Appl. No.: 15/227,673

(22) Filed: Aug. 3, 2016

(65) Prior Publication Data

US 2017/0336054 A1 Nov. 23, 2017

(30) Foreign Application Priority Data

May 18, 2016 (CN) .......................... 2016 1 0331690

(51) Int. Cl.
| | |
|---|---|
| *F21K 2/00* | (2006.01) |
| *F21V 19/00* | (2006.01) |
| *H01L 33/50* | (2010.01) |
| *F21Y 113/13* | (2016.01) |

(Continued)

(52) U.S. Cl.
CPC .............. *H01L 33/504* (2013.01); *F21K 2/00* (2013.01); *F21V 19/0025* (2013.01); *H01L 25/0753* (2013.01); *H01L 33/505* (2013.01); *F21Y 2113/13* (2016.08); *F21Y 2115/10* (2016.08);

(Continued)

(58) Field of Classification Search
None
See application file for complete search history.

(56) References Cited

U.S. PATENT DOCUMENTS

| | | | | |
|---|---|---|---|---|
| D751,517 S | * | 3/2016 | Kuriki | .......................... D13/180 |
| 9,406,858 B2 | * | 8/2016 | Kuriki | ....................... F21K 9/00 |
| 9,865,573 B2 | * | 1/2018 | Kawano | .............. H01L 25/0753 |

(Continued)

*Primary Examiner* — Britt D Hanley
(74) *Attorney, Agent, or Firm* — Li & Cai Intellectual Property (USA) Office

(57) ABSTRACT

An LED package structure with multiple color temperatures includes a substrate, a circuit layer disposed on the substrate, a plurality of first LED chips and a plurality of second LED chips disposed on the circuit layer, and a light conversion layer disposed on the substrate and the circuit layer. The light conversion layer has a spiral surface arranged away from the substrate. The light conversion layer includes a first light conversion portion and a second light conversion portion arranged around a lateral side of the first light conversion portion. The color temperature of the first light conversion portion is different from that of the second light conversion portion. The first LED chips are embedded in the first light conversion portion, and the second LED chips are embedded in the second light conversion portion. Thus, the LED package structure provided by the instant disclosure has good production efficiency.

7 Claims, 13 Drawing Sheets

(51) Int. Cl.
*F21Y 115/10* (2016.01)
*H01L 25/075* (2006.01)

(52) U.S. Cl.
CPC ............... *H01L 2224/48091* (2013.01); *H01L 2933/0041* (2013.01)

(56) References Cited

U.S. PATENT DOCUMENTS

| | | | | |
|---|---|---|---|---|
| 2007/0096131 A1* | 5/2007 | Chandra | ............... | H01L 33/505 257/99 |
| 2010/0291313 A1* | 11/2010 | Ling | ..................... | C09K 11/02 427/475 |
| 2013/0170179 A1* | 7/2013 | Kadomi | ................. | C09K 11/02 362/84 |
| 2014/0098529 A1* | 4/2014 | Hata | .................... | H05K 1/0274 362/231 |
| 2015/0103511 A1* | 4/2015 | Miyashita | ............. | H01L 33/508 362/84 |
| 2017/0336054 A1* | 11/2017 | Lee | ....................... | H01L 33/504 |

* cited by examiner

US 10,396,252 B2

1

LED PACKAGE STRUCTURE WITH MULTIPLE COLOR TEMPERATURES AND METHOD FOR MANUFACTURING THE SAME

BACKGROUND OF THE INVENTION

1. Field of the Invention

The instant invention relates to an LED; in particular, to an LED package structure with multiple color temperatures and a method for manufacturing the same.

2. Description of Related Art

The conventional method for manufacturing a conventional multi-color LED package structure includes the following steps: forming a plurality of ring-shaped glue dams on a substrate to construct a plurality of mounting areas of the substrate; respectively mounting a plurality of LED chips on the mounting areas; and filling a plurality of fluorescent gels, which have different color temperatures, in the mounting areas to encapsulate the LED chips.

However, a gap is generated between two adjacent fluorescent gels, which have different color temperatures, such that the light uniformity and reliability of the multi-color LED package structure are influenced by the gap. Moreover, the forming process of the glue dams reduces the production efficiency of the multi-color LED package structure.

SUMMARY OF THE INVENTION

The instant disclosure provides an LED package structure with multiple color temperatures and a method for manufacturing the same for effectively solving the above problems generated from the conventional LED package structure and the conventional method.

In summary, the LED package structure and the method in the instant disclosure are provided for effectively increasing the light uniformity and reliability by forming a light conversion layer, which has a spiral outer surface.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

2

Figure 5:
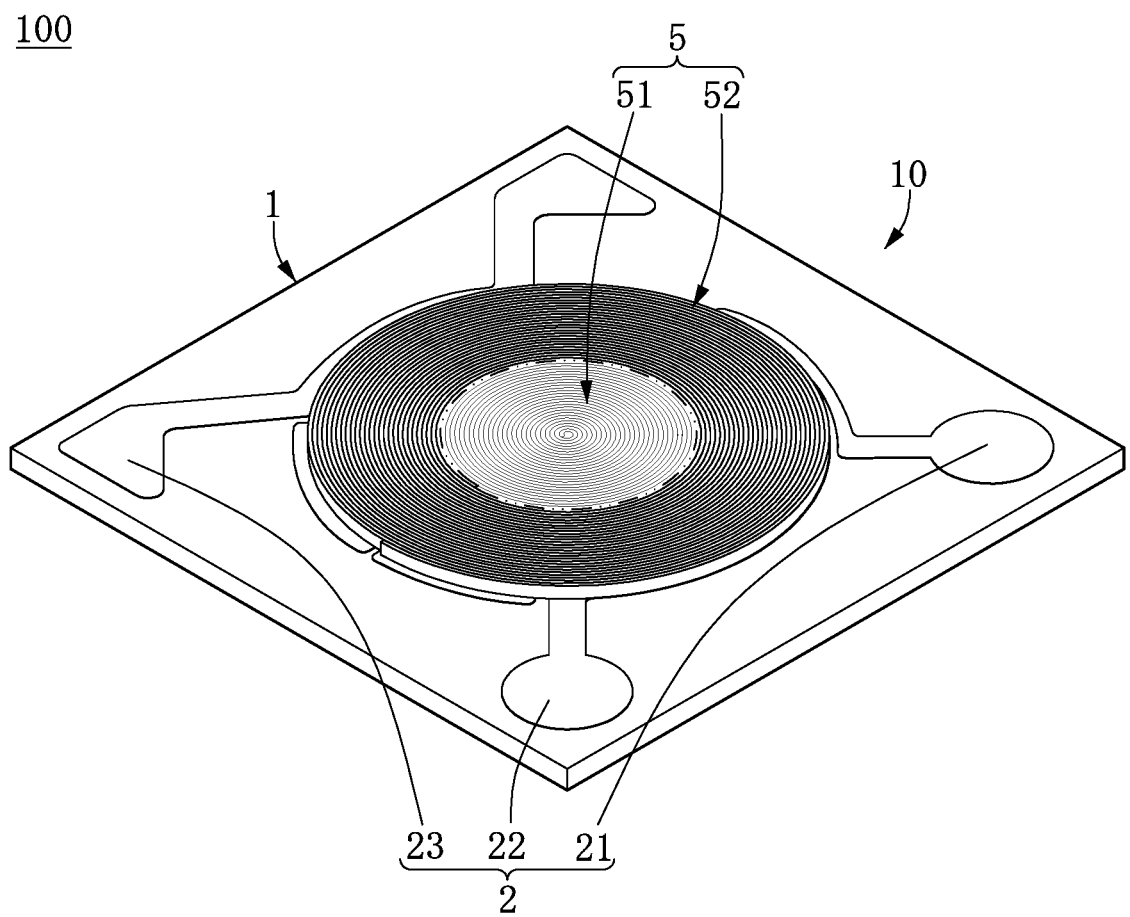
FIG. 5 is a perspective view showing an LED package structure with multiple color temperatures according to the first embodiment of the instant disclosure.
Figure 6:
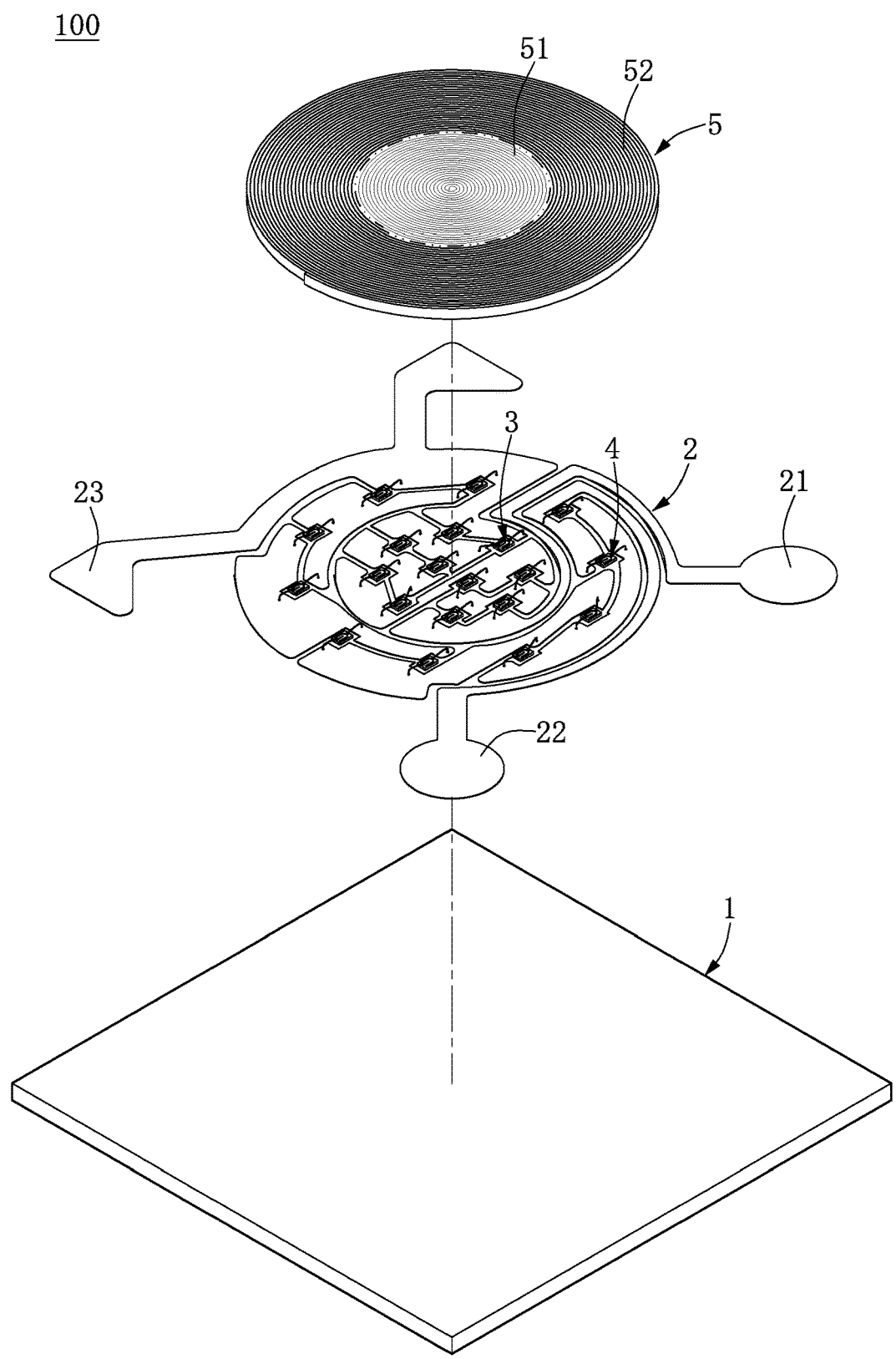
FIG. 6 is an exploded view of FIG. 5.
Figure 7:
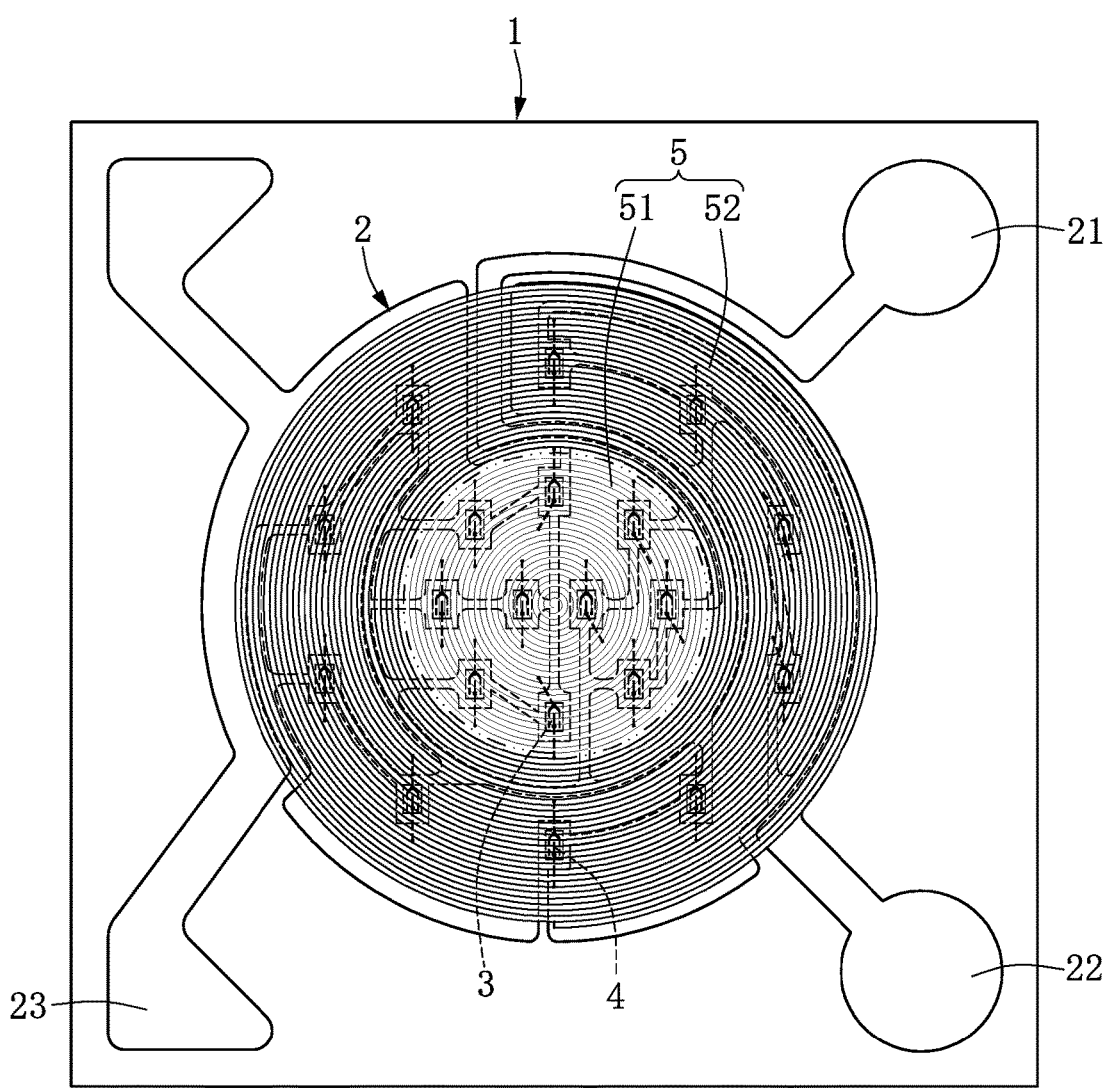
Figure 8:
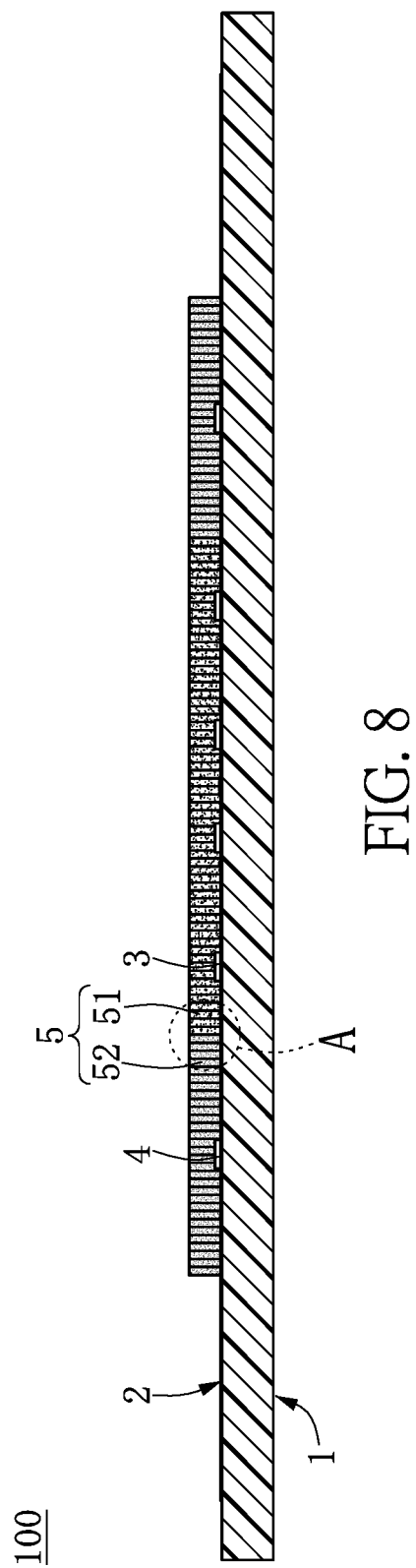
Figure 9:
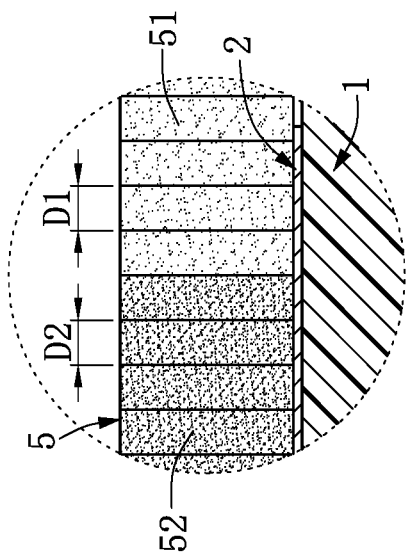
Figure 10:
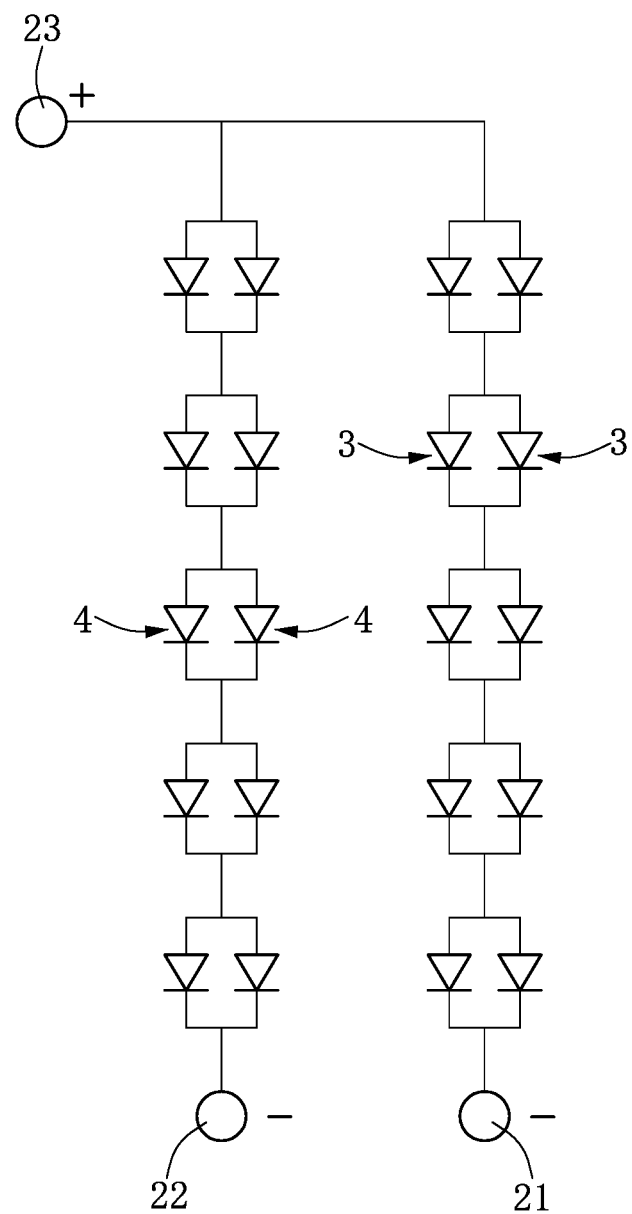
Figure 11:
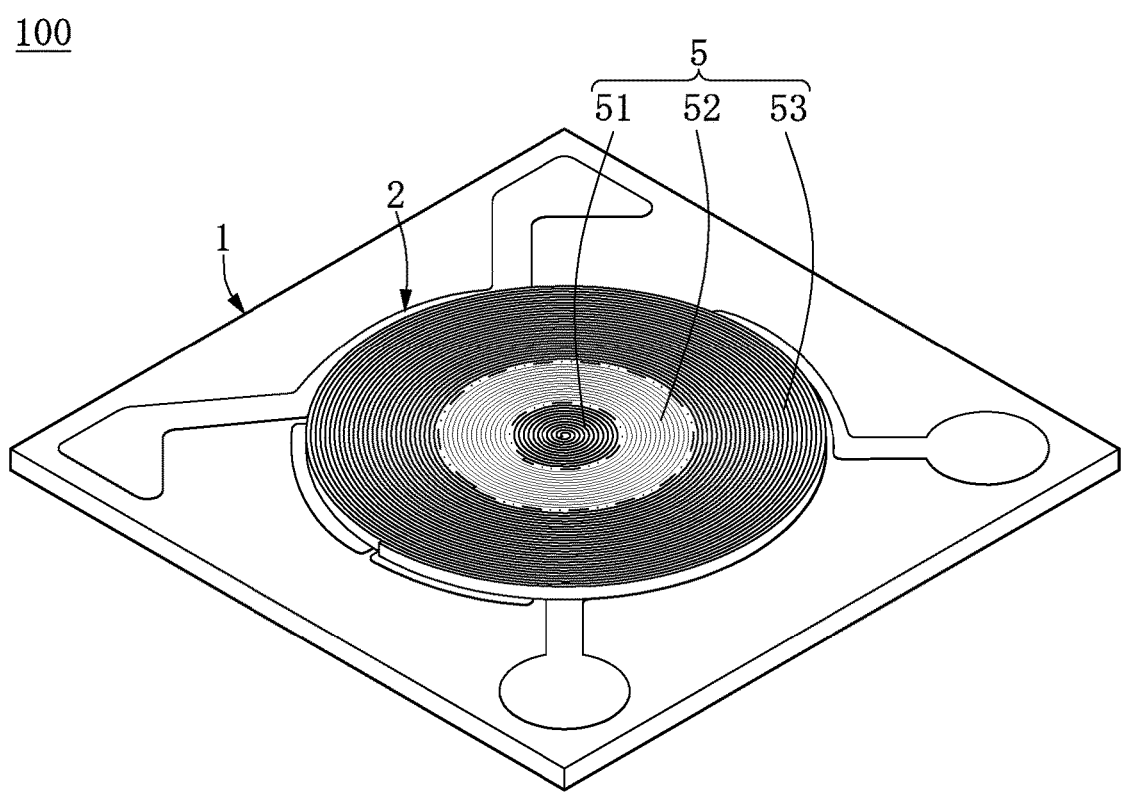
Figure 12:
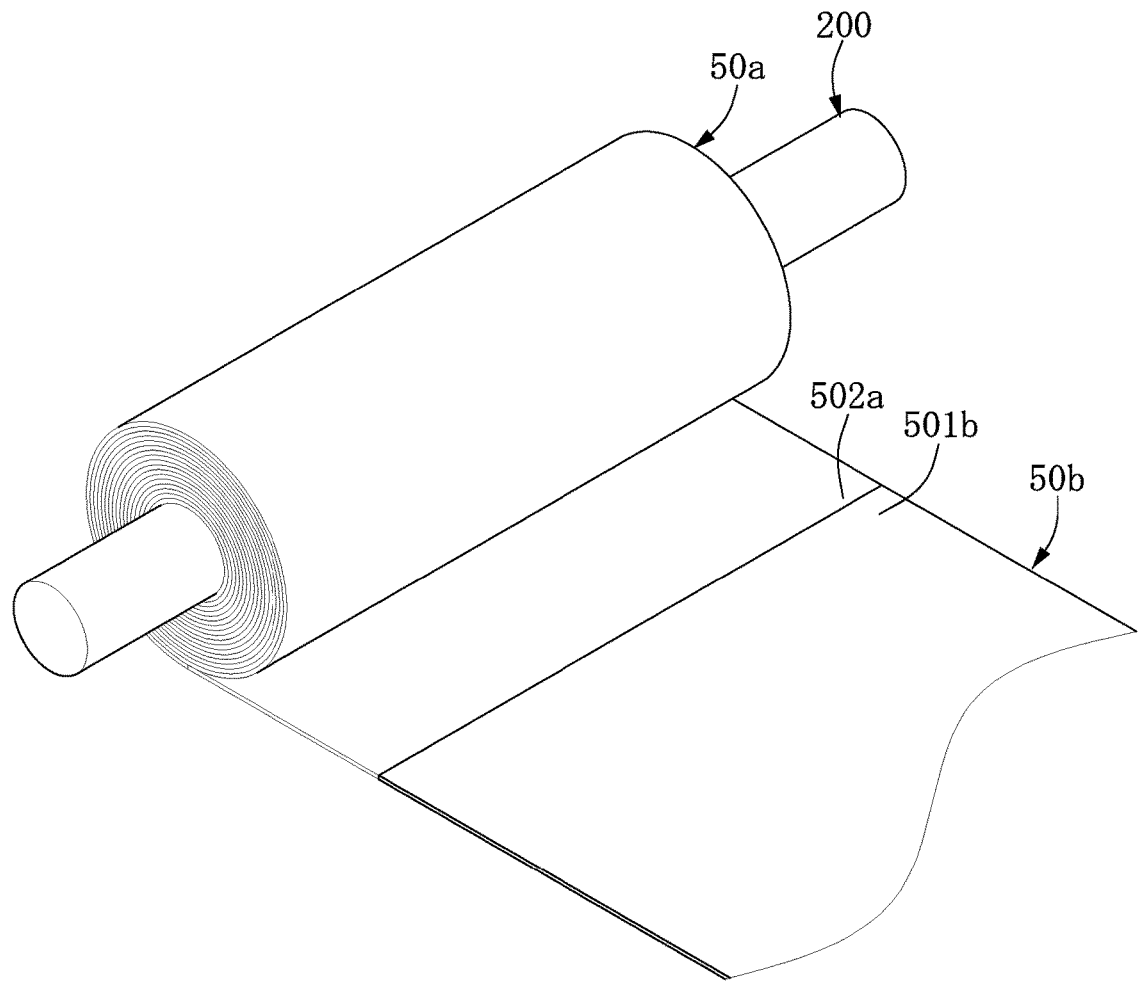
Figure 13:
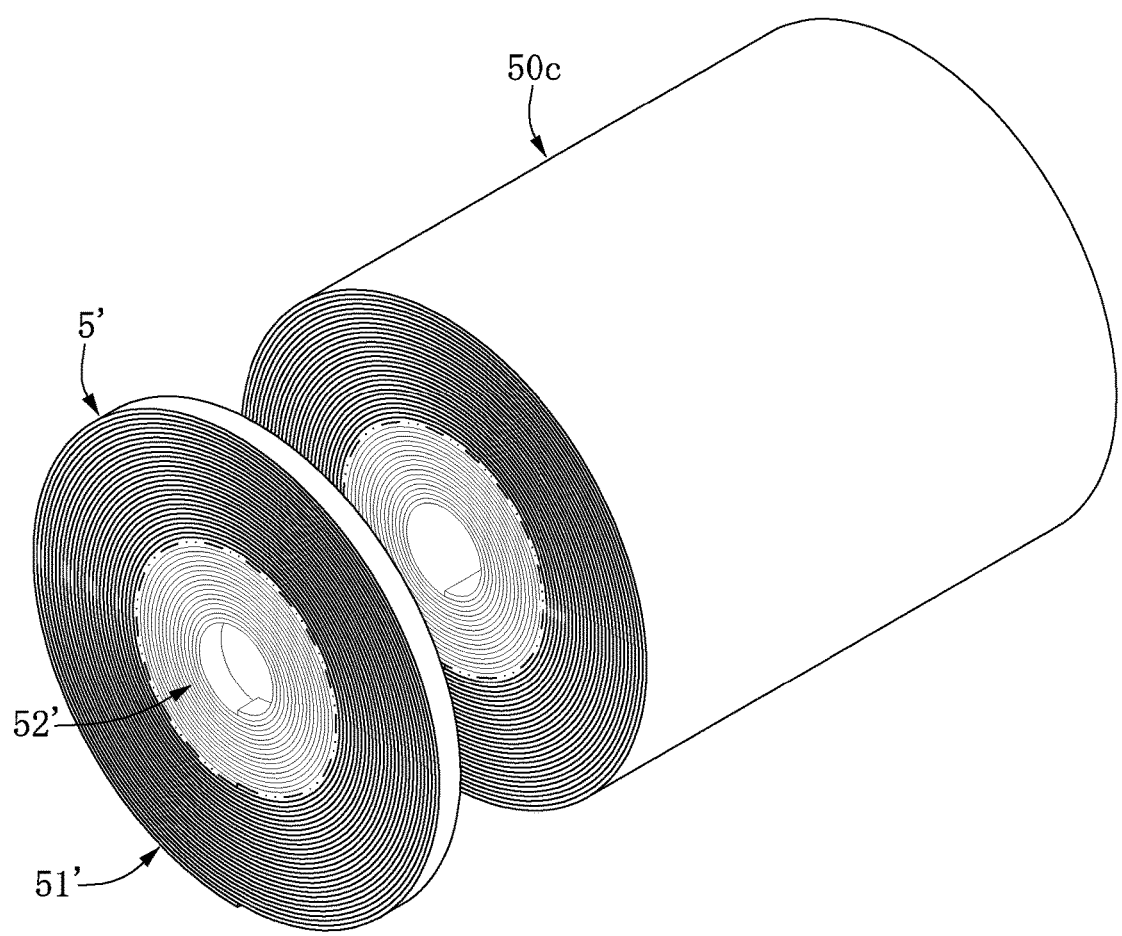
Figure 14:
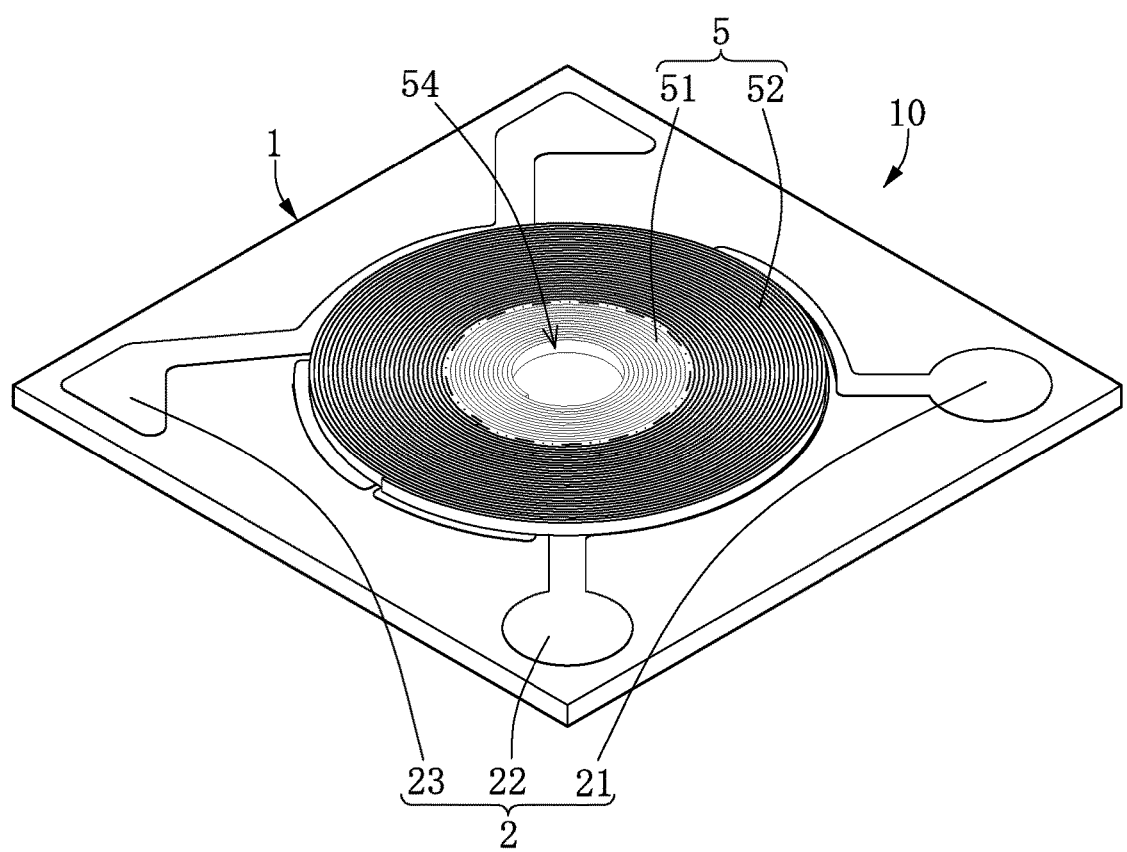

FIG. 7 is a top view of FIG. 5;

FIG. 8 is a cross-sectional view of FIG. 5;

FIG. 9 is an enlarged view of FIG. 8;

FIG. 10 is a schematic view showing an equivalent circuit of the LED package structure according to the first embodiment of the instant disclosure;

FIG. 11 is a perspective view showing a variety of the LED package structures according to the first embodiment of the instant disclosure;

FIG. 12 is a perspective view showing a rolling step of the method according to the second embodiment of the instant disclosure;

FIG. 13 is a perspective view showing a slicing step of the method according to the second embodiment of the instant disclosure; and FIG. 14 is a perspective view showing an LED package structure with multiple color temperatures according to the second embodiment of the instant disclosure.

DETAILED DESCRIPTION OF THE PREFERRED EMBODIMENTS

First Embodiment

Please refer to FIGS. 1 through 10, which show a first embodiment of the instant disclosure. References are hereunder made to the detailed descriptions and appended drawings in connection with the instant invention. However, the appended drawings are merely shown for exemplary purposes, rather than being used to restrict the scope of the instant invention.

As shown in FIGS. 1 through 5, the instant embodiment discloses a method for manufacturing an LED package structure 100 with multiple color temperatures, and the method includes the steps as follows.

Figure 1:
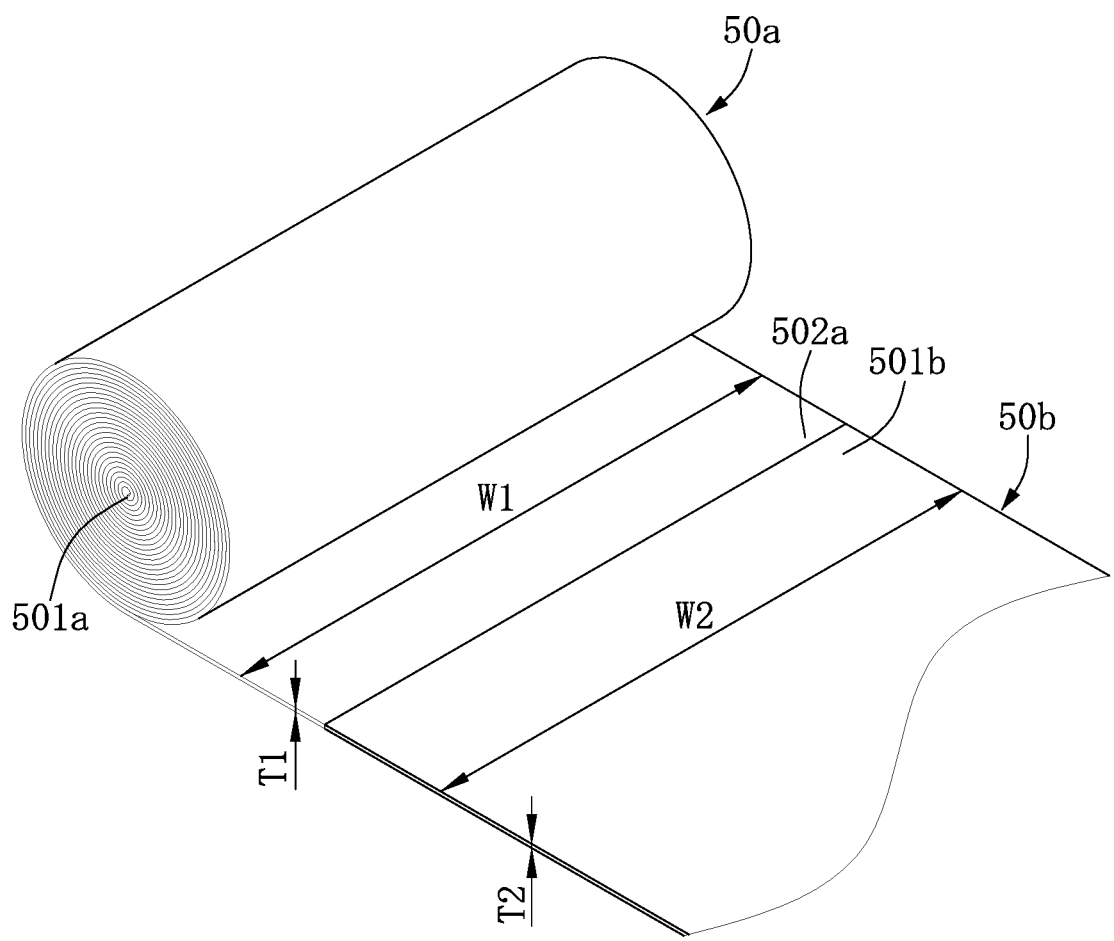
FIG. 1 is a first perspective view showing a rolling step of a method according to a first embodiment of the instant disclosure.
Figure 4:
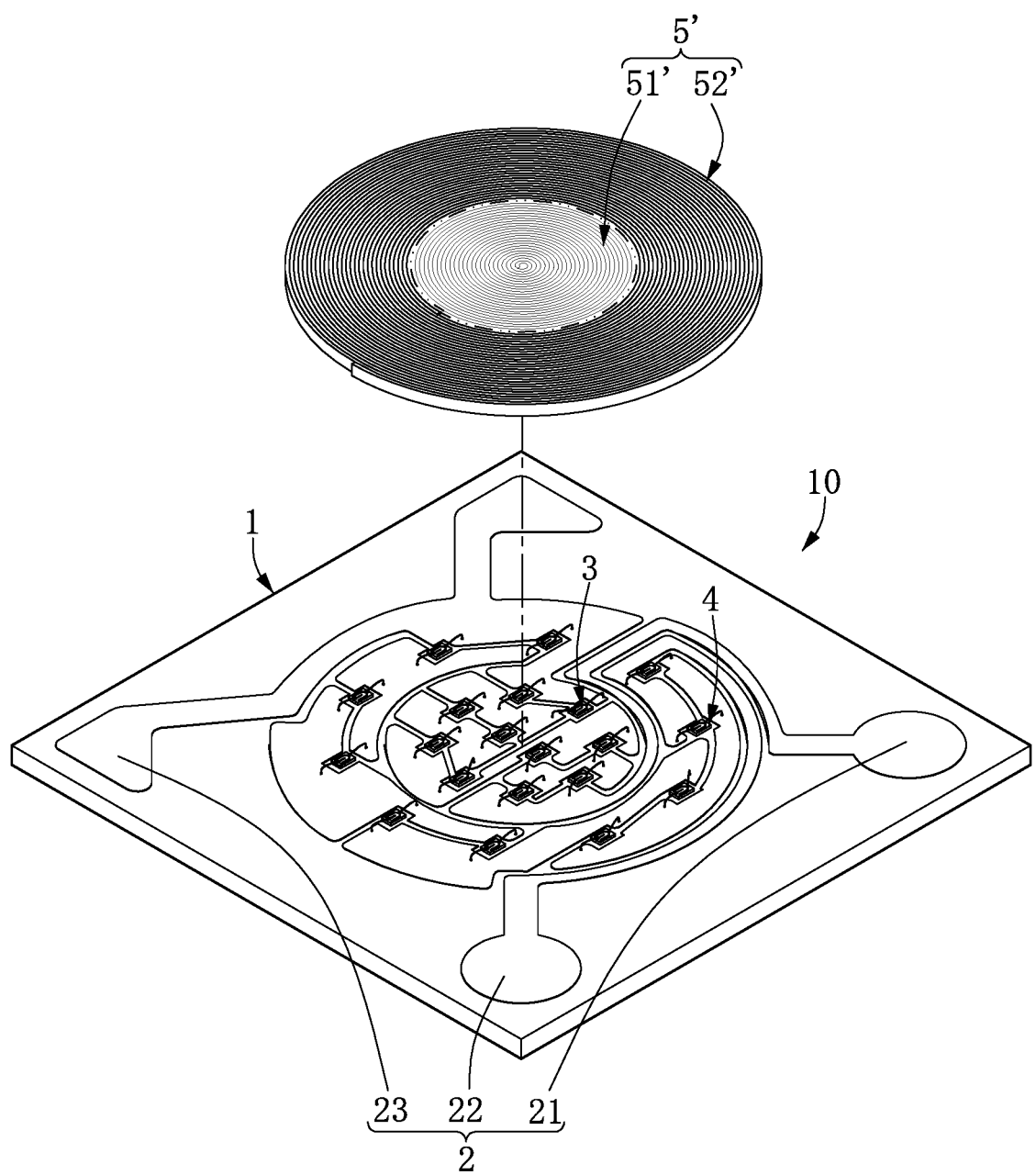
FIG. 4 is a perspective view showing an encapsulating step of the method according to the first embodiment of the instant disclosure.

As shown in FIG. 1, a preparing step is implemented by providing a lighting module 10 (as shown in FIG. 4), an elongated first light conversion film 50a (or named as a cool color film), and an elongated second light conversion film 50b (or named as a warm color film). The lighting module 10 (as shown in FIG. 4) includes a substrate 1, a circuit layer 2 disposed on the substrate 1, a plurality of first LED chips 3 disposed on the circuit layer 2, and a plurality of second LED chips 4 disposed on the circuit layer 2.

Specifically, a width W1 of the first light conversion film 50a is equal to a width W2 of the second light conversion film 50b, and a thickness T1 of the first light conversion film 50a (i.e., 80 µm) is smaller than a thickness T2 of the second light conversion film 50b (i.e., 110 µm). In general, in condition of the same silicone content are provided with the same volume of the phosphor powders for the cool color film and the warm color film to obtain better quality, the concentration of the phosphor powders of the cool color film is lower than that of the warm color film and the thickness of the cool color film is thinner than that of the warm color film. In other words, the light efficiency, light uniformity and reliability can be influenced by the thickness of the light conversion film. Each of the first light conversion film 50a and the second light conversion film 50b has a start end 501a, 501b and a finish end 502a, 502b arranged at two opposite ends in a longitudinal direction thereof. The finish end 502a of the first light conversion film 50a in the instant embodiment is connected to the start end 501b of the second light conversion film 50b, but the instant disclosure is not limited thereto.

Moreover, a first color temperature of the first light conversion film 50a is different from a second color temperature of the second light conversion film 50b. In the instant embodiment, the first color temperature is higher than the second color temperature. For example, the first color temperature is a cool color temperature and is approximately 5000K~6000K, and the first color temperature is preferably 5600K; the second color temperature is a warm color temperature and is approximately 2200K~3200K, and the second color temperature is preferably 2700K.

Figure 2:
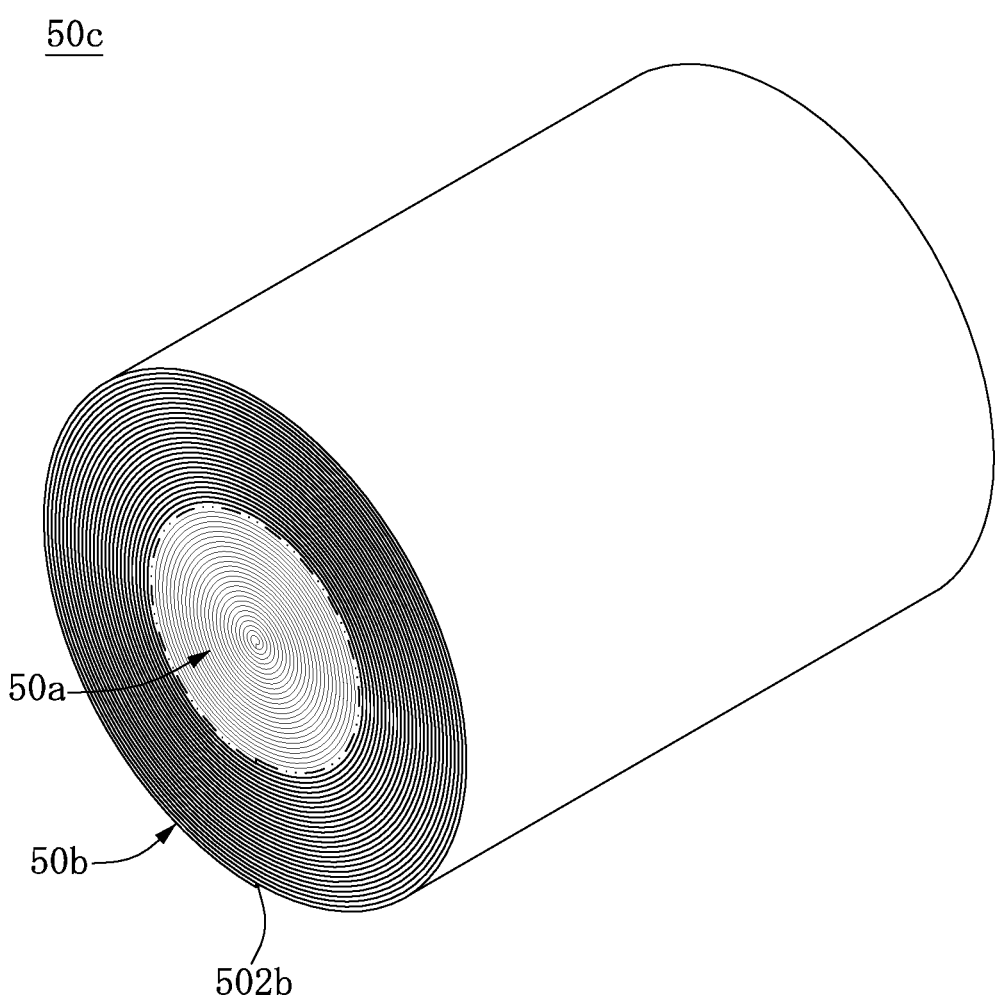
FIG. 2 is a second perspective view showing the rolling step of the method according to the first embodiment of the instant disclosure.

As shown in FIGS. 1 and 2, a rolling step is implemented by rolling the first light conversion film 50a from the start end 501a to the finish end 502a thereof and then rolling the second light conversion film 50b from the start end 501b to the finish end 502b thereof to construct a column-like construction 50c. In other words, the column-like construction 50c is formed by rolling the second light conversion film 50b around an outer edge of the rolled first light conversion film 50a.

The column-like construction 50c in the instant embodiment is a round column having a diameter of 1 cm, but the instant disclosure is not limited thereto. For example, the column-like construction 50c formed by the first light conversion film 50a and the second light conversion film 50b can be a square column or a triangular column according to the designer's demand.

Figure 3:
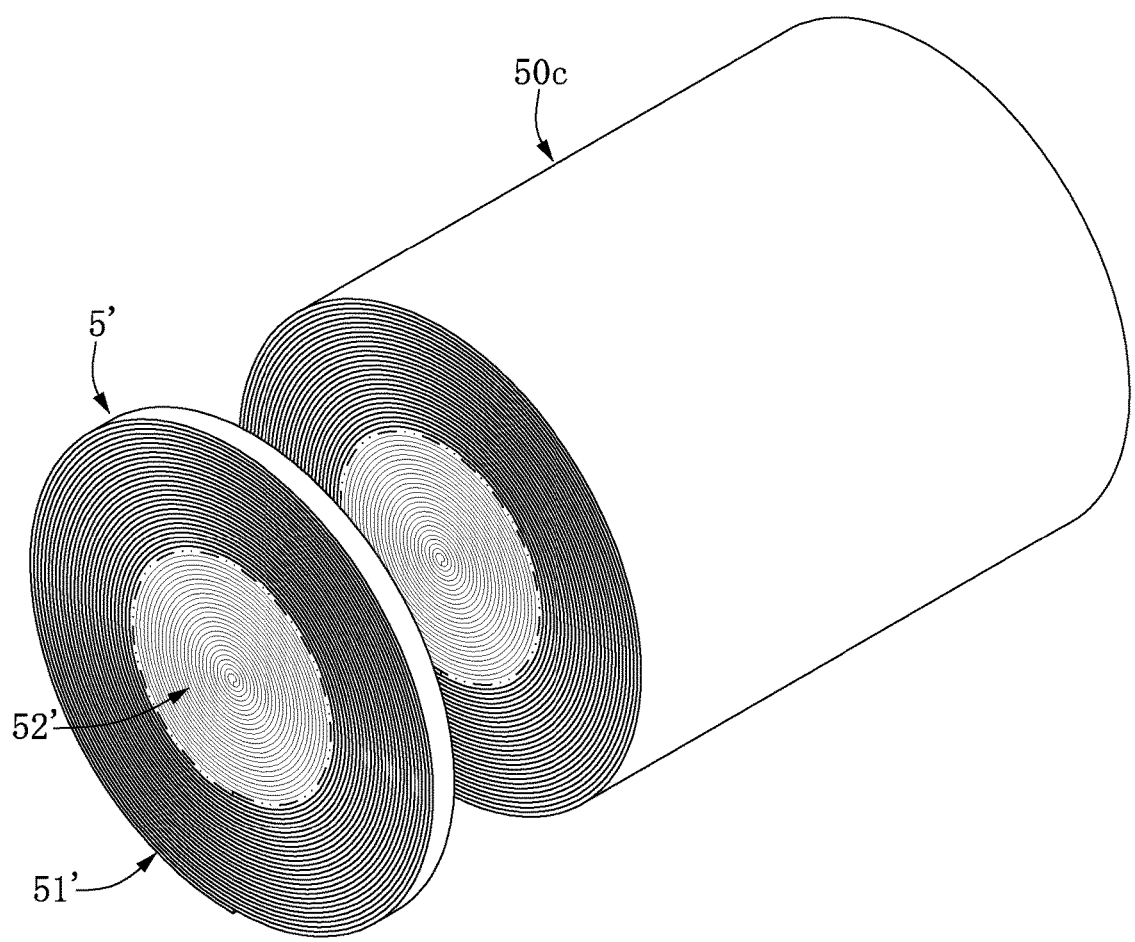
FIG. 3 is a perspective view showing a slicing step of the method according to the first embodiment of the instant disclosure.

As shown in FIG. 3, a slicing step is implemented by slicing the column-like construction 50c to form an encapsulation sheet 5'. Specifically, the column-like construction 50c is sliced along a cross-section of the column-like construction 50c, which is perpendicular to a centerline of the column-like construction 50c, to form the encapsulation sheet 5' having a predetermined thickness. Moreover, a thickness of the encapsulation sheet 5' is greater than that of each of the first LED chips 3 or that of each of the second LED chips 4. The thickness of the encapsulation sheet 5' in the instant embodiment is approximately 50 μm~500 μm. The encapsulation sheet 5' includes a first portion 51' having a first color temperature and a second portion 52' having a second color temperature. The encapsulation sheet 5' has two opposite spiral surfaces.

As shown in FIGS. 4 and 5, an encapsulating step is implemented by combining the encapsulation sheet 5' onto the substrate 1 to form a light conversion layer 5. Specifically, the first LED chips 3 are embedded in the first portion 51' of the encapsulation sheet 5', the second LED chips 4 are embedded in the second portion 52' of the encapsulation sheet 5'. The first LED chips 3 and the second LED chips 4 can be provided for emitting blue light, or the first LED chips 3 and the second LED chips 4 can be provided for emitting light in a different color. The encapsulation sheet 5' is combined with the substrate 1 by using at least one of a heating manner, a pressing manner, or an adhering manner, but the instant disclosure is not limited thereto.

Moreover, the light conversion layer 5 (or the first light conversion film 50a and the second light conversion film 50b) includes a resin and a plurality of light conversion particles mixed in the resin. The resin can be a thermoplastic resin (e.g., silicone), and the light conversion particles are composed of at least one of phosphor powders, quantum dots, and light scattering particles. The resin in the instant embodiment can be a thermosetting resin, such as a B-stage silicone, and a storage modulus of the resin in room temperature (e.g., 0~30° C.) is 100 MPa or 100 MPa~500 MPa, obtained by using a dynamic thermomechanical analysis (DMA) test. The B-stage silicone can be softened by heating and has a curing degree of 60%~80%, obtained by using a differential scanning calorimetry (DSC) test.

In addition, the resin in the instant embodiment can be a curable hot-melting resin (e.g., silicone), and the hot-melting resin is solid at room temperature (e.g., 0~30° C.) and can be softened by heating. The storage modulus of the resin in room temperature (e.g., 0~30° C.) is 100 MPa or 100 MPa~500 MPa, obtained by using the DMA test, and the storage modulus of the hot-melting resin in 60° C.~80° C. is 0.1 Mpa~0.5 Mpa. An elongation at break of the hot-melting resin is greater than 60%, obtained by using a tensile machine.

The LED package structure 100 with multiple color temperatures can be prepared by implementing the above method, and the detailed construction of the LED package structure 100 is disclosed in the following description for more clearly realizing the instant disclosure.

As shown in FIGS. 5 through 8, the LED package structure 100 includes a substrate 1, a circuit layer 2 disposed on the substrate 1, a plurality of first LED chips 3 disposed on the substrate 1 and electrically connected to the circuit layer 2, a plurality of second LED chips 4 disposed on the substrate 1 around the first LED chips 3 and electrically connected to the circuit layer 2, and a light conversion layer 5 disposed on the substrate 1 and the circuit layer 2. The substrate 1 in the instant embodiment has a square shape, and the circuit layer 2 includes a first circuit 21, a second circuit 22, and a third circuit 23 separated away from each other. As shown in FIG. 10, the first circuit 21 and the third circuit 23 are electrically connected to the first LED chips 3, and the second circuit 22 and the third circuit 23 are electrically connected to the second LED chips 4. Specifically, the first LED chips 3 and the second LED chips 4 are electrically connected to the same third circuit 23 (positive electrode), the first LED chips 3 are individually driven by using the first circuit 21 (negative electrode), and the second LED chips 4 are individually driven by using the second circuit 22 (negative electrode). The first LED chips 3 are arranged in five groups each having two parallel connected first LED chips 3, and the five groups of the first LED chips 3 are in a series connection. The second LED chips 4 are arranged in five groups each having two parallel connected second LED chips 4, and the five groups of the second LED chips 4 are in a series connection.

The light conversion layer 5 includes a first light conversion portion 51 and a second light conversion portion 52 arranged adjacent to a lateral surface of the first light conversion portion 51. The second light conversion portion 52 in the instant embodiment is arranged around the lateral surface of the first light conversion portion 51, but the instant disclosure is not limited thereto. A first color temperature of the first light conversion portion 51 is different from a second color temperature of the second light conversion portion 52. In the instant embodiment, the first color temperature is higher than the second color temperature. For example, the first color temperature is approximately 5000K~6000K, and the first color temperature is preferably 5600K; the second color temperature is approximately 2200K~3200K, and the second color temperature is preferably 2700K. However, the first color temperature can be lower than the second color temperature, such as the first color temperature is approximately 2200K~3200K and the second color temperature is approximately 5000K~6000K.

Moreover, the light conversion layer 5 has a spiral outer surface opposing to the substrate 1. In the spiral outer surface of the light conversion layer 5 shown in FIGS. 8 and 9, a spiral pitch D1 of the first light conversion portion 51 (i.e., 80 μm) is smaller than a spiral pitch D2 of the second light conversion portion 52 (i.e., 110 μm). In a non-shown embodiment, the spiral pitch D1 of the first light conversion portion 51 can be equal to or larger than the spiral pitch D2 of the second light conversion portion 52. The first LED chips 3 are embedded in the first light conversion portion 51 of the light conversion layer 5, and the second LED chips 4 are embedded in the second light conversion portion 52 of the light conversion layer 5.

In addition, the light conversion layer 5 in the instant embodiment is provided with two different color temperatures, but the light conversion layer 5 in the instant disclosure can be provided with three or more than three different color temperatures. For example, as shown in FIG. 11, the LED package structure 100 further includes a plurality of third LED chips (not shown) disposed on the substrate 1 and electrically connected to the circuit layer 2, the light conversion layer 5 includes a third converting portion 53, and the third LED chips are embedded in the third converting portion 53.

Second Embodiment

Please refer to FIGS. 12 through 14, which show a second embodiment. The second embodiment is similar to the first embodiment. A main difference is disclosed in the following description.

The difference in the method between the two embodiments is the rolling step. As shown in FIGS. 12 and 13, in the rolling step of the instant embodiment, the start end 501a of the first light conversion film 50a is positioned on a pillar 200, and then the first light conversion film 50a is rolled around the pillar 200 from the start end 501a thereof to the finish end 502b of the second light conversion film 50b to construct a column-like construction 50c, and the column-like construction 50c is a hollow construction after the pillar 200 is removed.

The difference in the construction between the two embodiments is the light conversion layer 5. As shown in FIG. 14, an inner edge of the first light conversion portion 51 surrounds to define an accommodating hole 54 for receiving at least one electronic component (not shown). It should be noted that the electronic component in the instant embodiment is preferably not an LED chip.

The Possible Effect of the Instant Embodiments

In summary, the LED package structure and the method in the instant embodiments are provided for effectively increasing the light uniformity and reliability by forming a light conversion layer which has the spiral outer surface.

Moreover, the light conversion layer is formed by the solid first light conversion film and the solid second light conversion film, so the LED package structure and the method in the instant embodiments do not have a phosphor precipitation problem. The second light conversion portion is closely connected to the first light conversion portion, so the LED package structure in the instant disclosure is formed without any glue dam.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:

1. A method for manufacturing an LED package structure, comprising the following steps:

implementing a preparing step by providing a lighting module and a B-stage encapsulation sheet, wherein the lighting module includes a substrate, a circuit layer disposed on the substrate, a plurality of first LED chips electrically connected to the circuit layer, and a plurality of second LED chips electrically connected to the circuit layer; wherein the B-stage encapsulation sheet includes an inner portion having a first color temperature and an outer portion having a second color temperature that is different from the first color temperature, and the outer portion enwraps around the inner portion in a subsequent manner, and wherein the B-stage encapsulation sheet includes the following steps:
  a) implementing a rolling step by rolling the first light conversion film from a start end to a finish end thereof and then rolling the second light conversion film from a start end to a finish end thereof to construct a column-like construction, wherein the column-like construction is formed by rolling the second light conversion film around an outer edge of the rolled first light conversion film; and
  b) implementing a slicing step by slicing the column-like construction to form the B-stage encapsulation sheet, wherein the B-stage encapsulation sheet has two opposite spiral surfaces, and a thickness of the B-stage encapsulation sheet is greater than that of each of the first LED chips or that of each of the second LED chips; and
implementing an encapsulating step by combining the B-stage encapsulation sheet onto the substrate so as to embed the first LED chips in the inner portion of the B-stage encapsulation sheet and to embed the second LED chips in the outer portion of the B-stage encapsulation sheet, wherein the B-stage encapsulation sheet is formed as a light conversion layer, and the light conversion layer includes a B-stage resin having a storage modulus of 100 MPa or 100 MPa~500 MPa in 0~30° C. plurality of light conversion particles mixed in the B-stage resin, and wherein after the encapsulating step is implemented, one of the spiral surfaces of the B-stage encapsulation sheet arranged away from the substrate is flat.

2. The method as claimed in claim 1, wherein the first color temperature is higher than the second color temperature, a width of the first light conversion film is equal to that of the second light conversion film, and a thickness of the first light conversion film is smaller than that of the second light conversion film.

3. The method as claimed in claim 1, wherein the first color temperature is approximately 5000K~6000K, and the second color temperature is approximately 2200K~3200K.

4. The method as claimed in claim 1, wherein in the preparing step, the finish end of the first light conversion film is connected to the start end of the second light conversion film.

5. The method as claimed in claim 1, wherein the resin is a thermoplastic resin, and the light conversion particles are composed of at least one of phosphor powders, quantum dots, and light scattering particles.

6. The method as claimed in claim 1, wherein in the encapsulating step, the B-stage encapsulation sheet is combined with the substrate by using at least one of a heating manner, a pressing manner, or an adhering manner.

7. The method as claimed in claim 1, wherein in the rolling step, the start end of the first light conversion film is positioned on a pillar, and then the first light conversion film is rolled around the pillar from the start end thereof to the finish end of the second light conversion film to construct the column-like construction, and the column-like construction is a hollow construction after the pillar is removed.

\* \* \* \* \*